United States Patent [19]
Fang et al.

[11] Patent Number: 5,401,980
[45] Date of Patent: Mar. 28, 1995

[54] 2D/1D JUNCTION DEVICE AS A COULOMB BLOCKADE GATE

[75] Inventors: Frank F. Fang; Richard A. Webb, both of Yorktown Heights, N.Y.

[73] Assignee: International Business Machines Corporation, Armonk, N.Y.

[21] Appl. No.: 122,814

[22] Filed: Sep. 16, 1993

Related U.S. Application Data

[63] Continuation of Ser. No. 754,799, Sep. 4, 1991, abandoned.

[51] Int. Cl.$^6$ .............................................. H01L 27/12
[52] U.S. Cl. ........................................ 257/30; 257/9; 257/37; 257/288
[58] Field of Search ................. 257/9, 30, 34, 37, 288, 257/289

[56]  References Cited
U.S. PATENT DOCUMENTS

| | | |
|---|---|---|
| 3,904,889 | 1/1975 | Hamel . |
| 3,936,809 | 2/1976 | Zappe . |
| 4,055,847 | 10/1977 | Fletcher et al. ............ 257/34 |
| 4,171,235 | 10/1979 | Fraas et al. . |
| 4,249,094 | 2/1981 | Fulton . |
| 4,253,230 | 3/1981 | Davis ...................... 257/35 |
| 4,401,900 | 8/1983 | Faris . |
| 4,421,785 | 12/1983 | Kroger . |
| 4,536,781 | 8/1985 | Kroger . |
| 4,733,182 | 3/1988 | Clarke et al. . |
| 4,743,952 | 5/1988 | Baliga . |
| 4,831,421 | 5/1989 | Gallagher et al. ........ 257/34 |
| 5,075,736 | 12/1991 | Wada .................... 257/31 |
| 5,109,164 | 4/1992 | Matsui ................... 257/34 |

FOREIGN PATENT DOCUMENTS

| | | |
|---|---|---|
| 0214047 | 3/1987 | European Pat. Off. . |
| 0255416 | 2/1988 | European Pat. Off. . |
| 0256360 | 2/1988 | European Pat. Off. . |
| 62-211963 | 9/1987 | Japan . |
| 63-127577 | 5/1988 | Japan . |

OTHER PUBLICATIONS

Clarke, "Small-Scale Analog Applications of High-Transition-Temperature Superconductors", Nature vol. 333, May 5, 1988, pp. 29–35.
IBM Technical Disclosure Bulletin, vol. 19, No. 11, Apr. 1977, p. 4463.
IBM Tedhnical Disclosure Bulletin, vol. 23, No. 9, Feb. 1983, pp. 4602–4606.
IBM Tchnical Disclosure Bulletin, vol. 29, No. 5, Oct. 1986, pp.2299–2301.
IBM Technical disclosure Bulletin, vol. 29, No. 7, Dec. 1986, p. 3048.
IBM Technical disclosure Bulletin, vol. 29, No. 10, Mar. 1987, pp. 4398–4399.
IBM, Technical disclosure Bulletin, vol. 30, No. 2, Jul. 1987, pp. 869–870.
IBM Technical Disclosure Bulletin, vol. 31, Dec. 1988, pp. 20–21.

(List continued on next page.)

*Primary Examiner*—Andrew J. James
*Assistant Examiner*—Courtney A. Bowers
*Attorney, Agent, or Firm*—Whitham, Curtis, Whitham & McGinn

[57]  ABSTRACT

A junction is formed by the establishment of first and second adjacent conductivity regions having a transition therebetween from wide (2D) to narrow (1D) with respect to the electron wavelength at the Fermi level. The electrons in the wide region can be propagated at any of a continuum of energies in two dimensions while, in the narrow region, allowable energies become quantized, forming a potential barrier similar to a junction in a tunnel diode. The junction formed in this manner exhibits a Coulomb blockade effect and can be made to operate alternatively as an extremely small capacitance and a conductance to sequentially transfer single electrons, thus forming a Coulomb blockade gate. The Coulomb blockade gate can be used in an oscillator or in digital counting and memory applications.

14 Claims, 2 Drawing Sheets

OTHER PUBLICATIONS

IBM Technical Disclosure Bulletin, vol. 31, No. 10, Mar. 1989, pp. 150–152.

IBM Technical Disclosure Bulletin, vol. 32, No. 3B, Aug. 1989, pp. 452–453.

K. K. Likharev, Correlated discrete transfer of single electrons in ultrasmall tunnel junctions, Jan. 1988, pp. 144–158.

Susanta Sen, New Resonant-Tunneling Devices with Multiple Negative Resistance Regions, Aug. 1988, pp.402–404.

S. J. Lee and C. R. Crowell, Parasitic Source and Drain Resistance in High-Electron-Mobility Transistors, 1985, pp. 659–668.

Masahiro Tsuchiya, Dependence of resonant tunneling current on well widths in AIAs/GaAs/AIAs double barrier diode structures, pp. 88–90, Jul. 1986.

Robert C. Potter, Three-dimensional integration of resonant tunneling structures for signal processing and three-state logic, pp. 2163–2164, Jun. 1988.

Federico Capasso, Resonant tunneling spectroscopy of hot minority electrons injected in gallium arsenide guantum wells, pp. 930–932, Apr. 1987.

Serge Luryi, Quantum capacitance devices, Nov. 1987, pp. 501–502.

Mark Seeeny, Resonant interband tunnel diodes, Nov. 1988, pp. 546–548.

2D/1D JUNCTION DEVICE AS A COULOMB BLOCKADE GATE

This application is a continuation of U.S. patent application Ser. No. 07/754,799, filed Sept. 4, 1991, now abandoned.

BACKGROUND OF THE INVENTION

1. Field of the Invention

The present invention generally relates to semiconductor junction devices and, in particular, to junctions which exhibit quantum mechanical tunnelling.

2. Description of the Prior Art

It has long been understood and accepted that the behavior of electrons generally can be partially described as discrete particles which carry a discrete charge. Other behaviors of electrons can be more aptly described and explained as waves or wave packets. It has been similarly understood that most expressions of fundamental behavior of electrons in electrical currents are descriptions of gross behavior of large numbers of electrons and neglect the effects of behavior of individual electrons, which, when described, are usually expressed statistically. Numerous devices which exploit the statistically expressed quantum mechanical behavior of electrons have been developed, such as the Esaki, or tunnel, diode.

Tunnel diodes have an extremely narrow depletion region, forming a barrier to electron movement. However, under conditions of very low forward bias, a statistically predictable proportion of conduction electrons can initially tunnel through the junction from an energy level in the conduction band to an equal but empty energy level in the valence band, producing a differential negative resistance effect as if biased through the energy gap. At higher forward bias voltages, the tunnel diode performs like an ordinary junction diode. The tunnel diode is a low-noise, high speed device and has many applications, particularly in UHF technology.

As electronic devices, and storage devices in particular, have been formed at ever higher degrees of integration density, there has been an increased interest in the behavior of individual electrons and devices which are capable of exploiting this behavior. In many high capacity dynamic RAMs, for example, storage may be accomplished with only a few dozen electrons. Thus, individual electron behavior is of importance since leakage of only a single electron may represent a significant fraction of stored charge.

It has long been speculated and recently verified that, under the influence of particular electron transport mechanisms, electrons can move in a discrete fashion. Such a mechanism is provided when the electron passage is restricted to a small junction where the conduction mechanism is by quantum mechanical tunnelling. A theoretical discussion of single electron tunnelling is provided in CORRELATED DISCRETE TRANSFER OF SINGLE ELECTRONS IN ULTRA SMALL TUNNEL JUNCTIONS, by K. K. Likarev, IBM J. Res. Develop., Vol. 32, No. 1, January, 1988, pp. 144–158, which is hereby fully incorporated by reference. This paper particularly describes studies of conduction in metallic granular thin films at extremely low temperatures approaching that of liquid Helium. The observability of single electron tunnelling events is shown to be possible if the capacitance between metallic grains of the thin film is small, say $10^{-17}$F or smaller and the energy, $$E_Q = e^2/2C,$$

associated with the transfer of charge from one metallic grain to another, which is not temperature dependent, becomes comparable to so-called shot noise arising from conduction in tunnel junctions at bias voltages exceeding a thermally dependent voltage $$V = k_B T/e.$$

Therefore, at any temperature such that $$E_Q > k_B T$$

can be satisfied, tunnelling becomes extremely unlikely at low bias voltages. As noted in the above-incorporated paper, at temperatures $$T < T_0, \text{ where } T_0 \equiv e^2/2k_B C,$$

no tunnelling happens if the difference in charge across the junction, Q, is an integral multiple of e, i.e. 0, 1, 2, 3, ... This effect is known as the "Coulomb blockade of tunnelling" and the existence of this effect is crucial to observation of single electron tunnelling effects.

If, on the other hand, the charge difference across the capacitor is a half integral multiple of e, it is known that this Coulomb blockade disappears. The reason for this is that the charging energy of the system, $Q^2/2C$, is unchanged when the charge difference across the capacitor changes from $-e/2$ to $+e/2$, and thus there is no Coulomb barrier to overcome. The charge difference Q can be continuously changed by using a gate electrode or by change in the source-drain bias.

The possibility of observing and exploiting such single electron conduction effects has many implications, such as in the study or use of small but non-vanishing currents where discrete transfer of charge coexists with a quasi-continuous current which may be visualized by analogy to a dripping tap where the dripping consists of a plurality of discrete events but the flow in the conduit leading to the tap is a continuous, though small, flux. Other potentially useful possibilities include coherent tunnelling, sub-electron-charge control of DC current and digital electronics including single electron transistors and molecular circuit elements. Given the small geometric scale of such junctions, the potential for extremely large scale integration becomes clear.

The practical realization of even the possibility of study of these effects has been limited by the appearance that these effects occur in thin-film media only at liquid nitrogen temperatures and below, although some recent experiments involving two closely spaced but separate conductors have yielded results consistent with a Coulomb blockade effect at higher temperatures. However, at liquid nitrogen temperatures and below, single electron conductivity effects may be masked or otherwise disturbed by superconductivity effects. Further, any use or exploitation of these effects in a practical device would rely on the ability to reliably produce these effects at elevated (e.g. non-cryogenic) temperatures.

SUMMARY OF THE INVENTION

It is therefore an object of the present invention to provide a semiconductor structure in which single electron tunnelling effects can be Controlled at elevated temperatures.

It is another object of the invention to provide a semiconductor structure which will provide a very low capacitance junction which will display the Coulomb blockade effect at elevated temperatures.

It is a further object of the invention to provide a single electron transfer mechanism which is operable above cryogenic temperatures.

It is another further object of the invention to provide a structure which can be made with present semiconductor technology which obviates the need to provide physically reduced size of junctions in order to reduce capacitance to a point where single electron transfer mechanisms can exist.

It is an additional object of the invention to provide a current or voltage tunable oscillator operating in accordance with the single electron tunnelling frequency and other practical applications of sequential electron tunnelling by exploiting the Coulomb blockade effect.

It is another further object of the invention to provide an electronic device having a junction formed by a geometrical transition in a conductive structure.

In order to satisfy the above and other objects of the invention, a tunnel diode structure is provided including first and second planar regions having a potential barrier and a wide to narrow transition established therebetween.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
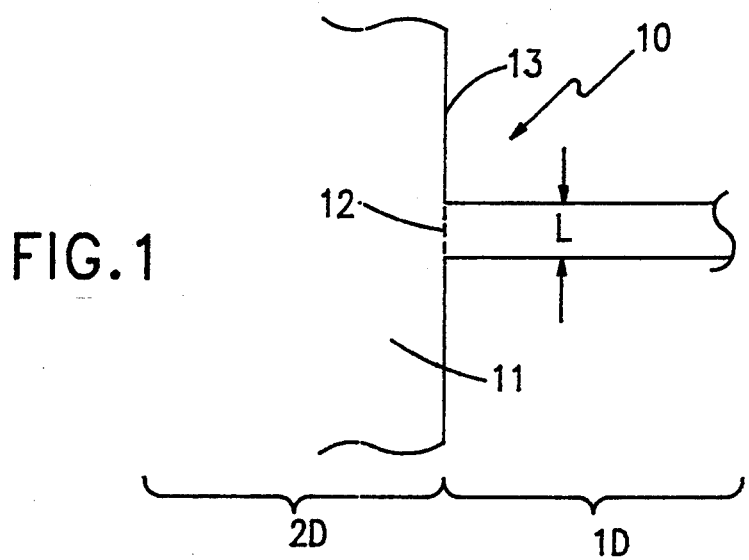
FIG. 1 is a diagram of a basic form of the invention.

Referring now to the drawings, and more particularly to FIG. 1, there is shown a basic diagram of the invention 10. The pattern shown denotes the boundary of a conductive region 11, which comprises a functionally one-dimensional region, hereafter referred to as 1D, to the right in FIG. 1 and a functionally two-dimensional region, hereafter referred to as 2D, to the left in this view. A junction is formed in the region denoted by dotted line 12, as will be described in greater detail below. It is important to note that the junction so formed does not require any differential doping or change in conductivity type of the conductive region, but, in a preferred form of the invention, is solely a function of the dimensional change of the conductor.

Figure 2:
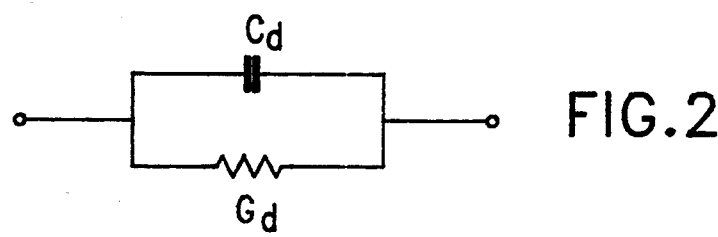
FIG. 2 is a diagram of an equivalent circuit of the invention of FIG. 1.

Referring briefly now to FIG. 2, an equivalent circuit of the device of FIG. 1 is shown. This equivalent circuit comprises a capacitance $C_d$ and a conductance $G_d$. It is sufficient for the present discussion and an understanding of the Coulomb blockade gate according to the present invention that the device will be shown to behave as an ideal capacitor $C_d$ below a certain energy and as a conductance $G_d$ above that value. The amount of energy transfer from the capacitance corresponding to the passage of a single electron through the device is sufficient, under certain conditions, to cause the energy across the device to fall from above that certain energy to below it and the device will alternately behave as a capacitance and a conductance.

To understand how a junction can be formed solely by a dimensional change in a conductor and the behavior of the device according to the equivalent circuit of FIG. 2, it will be recalled that electrons associated with an atom of a particular element can only assume certain energy states. In a metal or a doped semiconductor, the electrons in the conduction band can be visualized as a cloud of electrons which can move about more or less freely in all directions, which is often referred to as an electron gas.

When the electrons are confined at the surface or an interface of a semiconductor such as a semiconductor-insulator interface below a gate electrode, their motion perpendicular to that surface becomes quantized according to the Bohr-Sommerfield quantization rule, i.e. the momentum in that direction must be a multiple of a constant, $\hbar$, the Planck constant/$2\pi$. Under this condition, the motion of electrons is only free in the planar directions and the system is often referred to as a two-dimensional electron gas (2DEG). The electron wave vector, k, is given by $(2\pi n_s)^{\frac{1}{2}}$, where $n_s$ is the surface carrier concentration. The corresponding wavelength, $\lambda$, is just $(2\pi n_s)^{1/8}$, For a typical electron density of $10^{11}/cm^2$ in a 2D system, the wavelength is about 800 Angstroms. The allowed energy states have discrete momentum in the direction perpendicular to the surface or interface with energy approximately proportional to $1/z^2$ where z is the mean thickness of the inversion layer or the quantum well thickness. The density of states is independent of energy.

When the 2DEG is further confined in the lateral direction, say, to a width of L, the electron motion is also quantized according to the Bohr-Sommerfield rule, described above. Thus the electrons are free to move only in one direction. This is therefore herein referred to as a one-dimensional electron gas (1DEG). The allowed states are discrete and are proportional to $1/L^2$. The density of states is proportional to $E^{-\frac{1}{2}}$.

Figure 3:
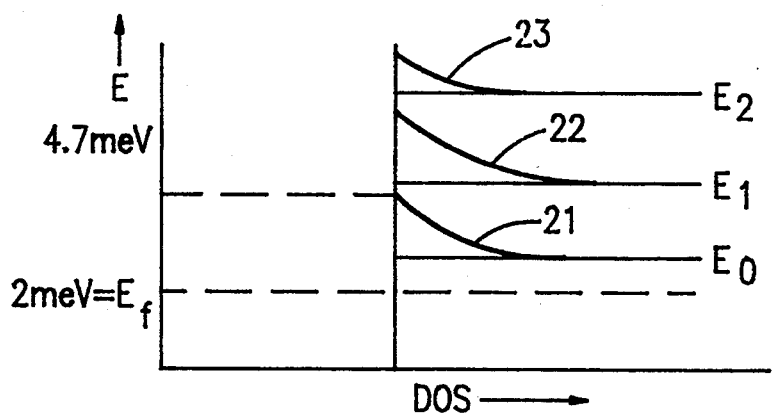
FIG. 3 is a schematic density of (electronic) states diagram of the device of FIG. 1.

FIG. 3 shows the density of states diagram for the configuration of the device according to the invention. The right and left sides of the junction are the 1D and 2D regions of the device, respectively. The Fermi energy of the 2D region is about 2 meV for an appropriate carrier density in a silicon (100) 2D layer. The 1D ground subband is 4.7 meV above the 2D ground subband edge for an appropriate 1D wire width, D. The detailed evaluation is described below.

As is well-understood, the transfer or propagation of an electron is enhanced when the energy of the electronic state on the one side of a boundary exactly matches the energy state on the other side of a boundary. That is, the transfer of an electron wave becomes most probable. Consequently, in the structure of the present invention, an electron wave can be propagated from the 2D region into the 1D region only when the energy of the electron state is equal to E0, E1, E2, etc. Near the junction, the wave propagation effects will cause the continuum of energies to the left of the junction to converge to the discrete energies, as shown at 21, 22, 23 when an appropriate bias is applied across the junction. Therefore, the boundary between the 2D region and the 1D region presents a potential barrier because of the alteration of conditions under which an electron can be propagated. If an electron wave can be propagated into the 1D region, it does so at a constant energy and the number of occupied states on the 2D side of the junction matches the empty states on the 1D side of the junction. In other words, the density of energy states distribution abruptly changes from a continuum on the 2D side of the junction to a plurality of discrete levels within a short distance of the junction on the 1D side and only electrons reaching the junction having an energy state matching one of those empty discrete levels will be propagated while electrons having other energy states will be reflected.

Figure 4:
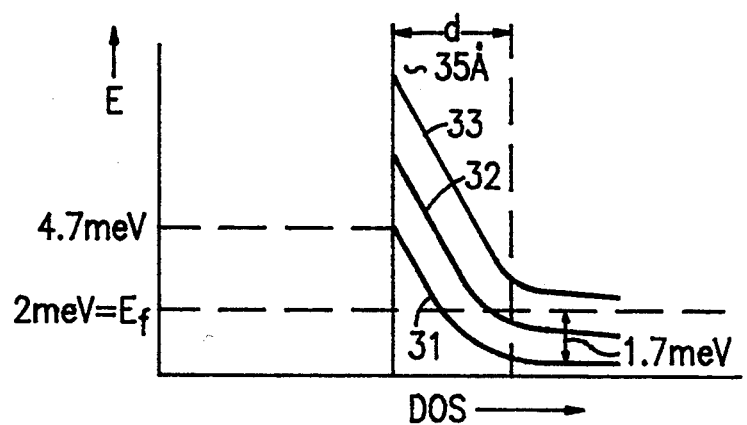
FIG. 4 is a schematic energy diagram of the device of FIG. 1, for the 1D subband energies $E_0$, $E_1$ and $E_2$, indicated in FIG. 3 but under conditions of applied bias voltage.

FIG. 4 shows a density of states diagram at the junction under conditions of applied bias. As in FIG. 3, the energies 31, 32, 33, are discrete and decline from levels corresponding to the left ends of 21, 22, 23, in FIG. 3 below the Fermi level, after a distance d, corresponding to the depletion length. For a 2D layer in N-type silicon, with a carrier concentration of about $3 \cdot 10^{11}/\text{cm}^2$, the Fermi energy is approximately 2 meV as shown and the 1D ground state, $E_0$, energy at the junction shown by curve 31 is 4.7 meV for the same material. This sharp increase followed by a decrease of density of state on the 1D side is lower than the Fermi level on the 2D side, is characteristic of the junctions of diodes in general and tunnel diodes, in particular, since there is no electronic state between $E_f$ and $E_0$ at the junction. Thus, it is seen that a diode junction can be formed solely by a sharp transition in the geometry of the conductor.

Having described the general concept of the invention, the function of the device of FIG. 1 will now be described analytically. The ground subband energy of a 1D system is given by $$E_0^{1D} = \frac{\hbar^2 \pi^2}{8mL^2}$$

where m is the electron effective mass, L is the 1D confinement (e.g. conductor width) and $\hbar$ is Planck's constant divided by $2\pi$. This energy is measured from the bottom of the 2D region ground subband.

The Fermi energy level on the 2D side of the junction is given by $$E_f^{2D} = \frac{n_s}{(DOS)^{2D}} = \frac{n_s \pi \hbar^2 \xi_v}{m}$$

where $n_s$ is the areal carrier concentration and $\xi_v$ is the valley degeneracy. For (100)Si, for example, the values of the parameters of these equations are
$\xi_v = 2$,
$m = 0.2\ m_0$ for a typical inversion layer, and
$n_s = 3 \times 10^{11}\ \text{cm}^{-2}$, and one finds:

$E_f^{2D} \simeq 2.0$ meV in the 2D region. For a 1D region width of $L = 10^{-6}$cm, one finds $E_0^{2D} \simeq 4.7$ meV.

By using Poisson's equation for line width L and a typical inversion layer thickness z of about 100 Angstroms, the depletion length can be estimated at about 35 Angstroms. This energy profile thus calculated is shown in FIG. 4. The capacitance of the junction can be similarly calculated as $C_d \simeq 3 \times 10^{-18}$ Farads.

If a single electron is stored in such a small capacitance, the potential energy of that stored electron is given by $$V_d = \frac{e^2}{2C_d} \simeq 26.7\ \text{meV}.$$

This amount of energy is equivalent to a temperature, T, of 300° K. If there is no leakage path through the junction, the capacitance would have to accumulate only one electron at the junction before a sufficient amount of energy was stored in the capacitance to cause a quantum transfer to the upper subband on the 1D side of the junction. This quantum transfer through the conductance $G_d$ reduces the potential energy from the capacitance and if the potential across the junction is maintained at a level approximating an energy between $E_f^{2D}$ and $E_0^{1D}$, the device will alternately act as a capacitance and a conductance, storing energy and charging as an electron approaches the junction and discharging when the electron stored energy reaches a stored potential energy $V_d$.

Stated another way, at low levels of current, the potential barrier of the junction initially appears as depicted in FIG. 3 and the junction appears as a capacitance. As an electron current, I, in the form of a wave approaches the junction, there is an accumulation of potential energy at the junction, the value of which is about $(It)^2/2C$ prior to the previously mentioned "discharge" stage. When the potential energy reaches $e^2/2C$, where e is the electron charge, the capacitor "discharges" a single electron as described above, and the process will repeat cyclically. The junction energy diagram will alternately vary by an energy $e^2/2C$ from that of FIG. 4.

The validity of the junction operation in this manner is for the condition where the thermal energy kT is much smaller than the barrier potential given by $E_0^{2D} - E_f$.

Since the energies determining the barrier potential are design parameters, as outlined above, a device according to the invention which operates at higher than cryogenic temperatures is therefore achievable.

Accordingly, for a constant charging current, the current through conductance $G_d$ will pulsate with an amplitude of $$I_G = \frac{eG_d}{2C_d}$$

(where $G_d$ is either zero or a positive value, depending on the amount of charge stored) and a frequency of approximately $G_d/C_d$, as long as $G_d < e/2I_G C_d$. Therefore, the device, itself, can function as a high frequency oscillator as a result of the Coulomb blockade effect. Applications to digital counting, memories and other digital circuitry will be apparent.

Figure 5:
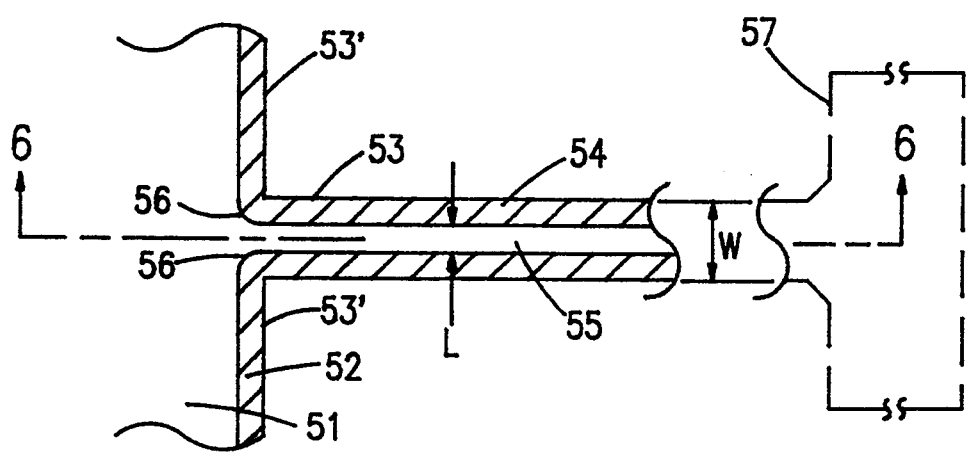
FIG. 5 is a detailed plan view of the device of FIG. 1.
Figure 6:
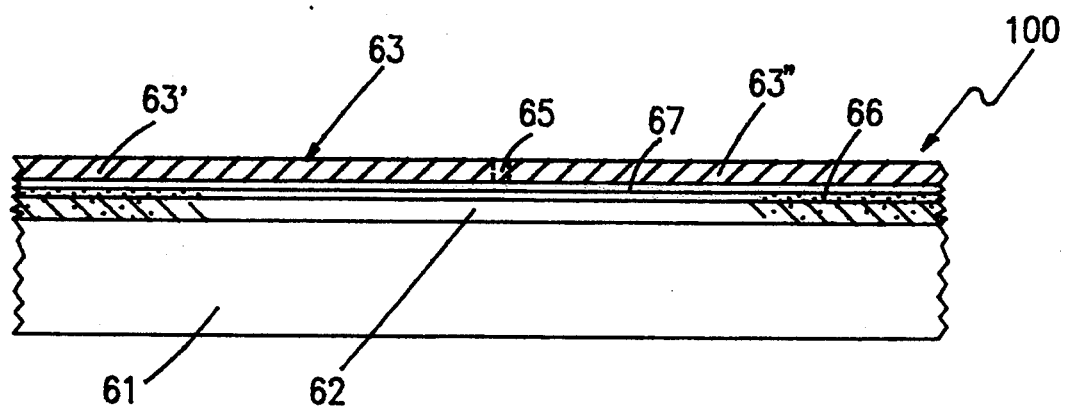
FIG. 6 is a cross-sectional view of the device of FIG. 1, taken along section line 6—6 of FIG. 5.

Referring now to FIGS. 5 and 6, a practical preferred construction will now be described. FIG. 5 corresponds to an enlargement of FIG. 1 and FIG. 6 is an expanded cross-sectional view along section line 6—6 of FIG. 5. In FIG. 5, the shape of the device is achieved in a lightly doped p-type layer 62, formed on substrate 61, by means of an appropriate bias with respect to the substrate applied to an electrode 63 formed according to the shape 53, 53' over a preferably thin insulator layer 67 (similar to a gate oxide layer). It is deemed preferable that the electrode should be formed with separate portions, 63' and 63'', separated by a gap 65 so that different voltages could be applied to each. However, gap 65 should be small (on the order of 100 Angstroms or less) and may be difficult to form as well as presenting the possibility of breakdown across the gap. It is anticipated that such a gap would provide the possibility of a sharper transition between the 2D and 1D regions of the device rather than a radius 56 in the boundary of the depletion region. In practice, however, this has not been found necessary to operability of the device and a single, continuous electrode layer can be used.

It should also be possible to alter the voltages applied to the 1D and 2D regions without the provision of a gap at location 65 in several ways, such as by passing a current through the electrode layer if the electrode is made slightly resistive. Since the electrode over the 1D region is very narrow, the voltage drop therein will be very much greater than in the 2D region. The thickness of the electrode over most of the 1D region could also be made greater to localize the voltage drop near the junction. Thus, if a voltage is applied to a connection pad such as that indicated by dotted line 57 in FIG. 5 which is different from the voltage applied to the portion of the electrode over the 2D region, a voltage drop can be caused in the region of the junction and the 1D and 2D regions can be held at slightly differing voltages.

The bias applied to electrode 63 or portions thereof 63', 63'' (hereinafter, simply 63) provides somewhat different effects in each of the 1D and 2D regions even if only a single voltage is applied to both regions. In the 2D region, the applied bias voltage is effective to produce an inversion layer 66 within the p-type layer 62 in a manner well-understood in the art. The thickness of the inversion layer will be about 50 Angstroms in silicon and about 120–150 Angstroms in gallium arsenide which confine electrons and form a two-dimensional electron gas near the semiconductor-insulator interface. In the 1D region and at the edge of the 2D region, at the boundary of the electrode, a depletion region is additionally formed. This has the effect of reducing the effective width of the 1D portion to establish a single mode electron propagation channel since, according to the invention, both the thickness and the width of the 1D region will approximate the wavelength of an electron.

It should be noted that 1D conduction regions have been previously formed in the art even though the effective width L must be on the order of 100–200 Angstroms and the minimum feature width W of the present level of technology is on the order of 300 Angstroms. Essentially this has been done in a manner similar to the present invention, by forming a depletion region under the sides of an electrode to decrease the effective channel width. However, the combination of formation of a depletion region at a 2D/1D geometrical transition, particularly in combination with the development of a 2D conduction structure, or developing a junction by forming such a transition has not heretofore been done.

While the use of a single electrode causes the development of a radius 56 at corners of the juncture of the 2D and 1D regions, this degradation of the sharpness of the transition does not prevent operability of the device and the discovery of the operability of this configuration and combination is deemed to be a basic element of this invention. That is, the formation of depletion regions 54 at the perimeter of the electrode defining the 1D region of about 35–50 Angstroms will sufficiently narrow the conduction portion of the 1D region 55 to an effective width L sufficiently to support operation as a one dimensional conductor in a manner consistent with the development of a sufficiently abrupt change in the density of states of the electrons that a junction will be formed solely due to the conductor geometry.

It should be understood that while the invention is theoretically operable at room temperatures, the phenomena and observations herein described will be more pronounced at temperatures of about 100–200 degrees, Kelvin, which, while far below room temperature, is very much elevated compared to temperatures where the Coulomb blockade effect has previously been observed.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An semiconducting device having a potential barrier formed by an abrupt change of at least one dimension in a conductive layer of the device, including means for inducing an increased population of electrons in a layer of semiconductor material, said layer having a thickness approximating an electron wavelength to form said conductive layer.

2. A semiconducting device as recited in claim 1 wherein said conductive layer is an inversion layer at a semiconductor-insulator interface.

3. A semiconducting device as recited in claim 2, wherein said semiconductor of said semiconductor-insulator interface is a lightly doped p-type layer.

4. A semiconductor structure having a conductive layer including a first planar conductivity region and a second planar conductivity region adjacent to said first planar conductivity region and having a potential barrier formed by a transition, from a dimension of said first planar conductivity region which is wide compared to the propagation wavelength of an electron therein to a dimension of said second planar conductivity region which is narrow compared to the propagation wavelength of an electron therein, between said first planar conductivity region and said second planar conductivity region, said semiconductor structure further including means for inducing an increased population of electrons in a layer of semiconductor material, said layer having a thickness approximating an electron wavelength to form said first planar conductivity region and said second planar conductivity region.

5. A semiconductor structure as recited in claim 4, wherein said first planar conductivity region and said second planar conductivity region comprise an inversion layer in a lightly doped semiconductor layer.

6. A semiconductor structure as recited in claim 5, further including an insulator layer formed on said lightly doped semiconductor layer and a patterned electrode layer, having a periphery, formed on said insulator layer, said periphery of said electrode layer defining said first planar conductivity region and said second planar conductivity region.

7. A method of establishing a potential barrier in a semiconductor material including the steps of
 establishing first and second planar conductivity regions having a transition therebetween from a dimension of said first planar conductivity region which is wide in the plane of said first planar conductivity region compared to the wavelength of an electron therein to a dimension of said second planar conductivity region which is narrow in the plane of said second planar conductivity region compared to the wavelength of the electron in the first region, and
 inducing an increased population of electrons in a layer of semiconductor material, said layer having a thickness approximating an electron wavelength to form said first planar conductivity region and said second planar conductivity region.

8. A method as recited in claim 7, wherein said step of inducing an increased population of electrons includes the further step of
 applying a voltage to an electrode overlying said first and second conductivity regions to establish an inversion layer in said layer of semiconductor material to form said first and second conductivity regions and a depletion region at a peripheral portion of said second conductivity region.

9. A method as recited in claim 7, wherein said step of inducing an increased population of electrons includes the further step of
 applying respective voltages to electrodes overlying each of said first and second conductivity regions to establish an inversion layer in said layer of semiconductor material to form said first and second conductivity regions and a depletion region at a peripheral portion of said second conductivity region.

10. A method as recited in claim 7, wherein said step of inducing an increased population of electrons includes the further step of
 applying voltages to respective locations on an electrode overlying said first and second conductivity regions to establish an inversion layer in said layer of semiconductor material to form said first and second conductivity regions and a depletion region at a peripheral portion of said second conductivity region.

11. A semiconductor device comprising
 a substrate,
 a lightly doped semiconductor layer overlying a portion of said substrate,
 an insulator layer overlying at least a portion of said lightly doped semiconductor layer, and
 means for inducing an increased population of electrons in said lightly doped semiconductor layer, said layer having a thickness approximating an electron wavelength, said means including at least one electrode overlying a portion of said insulator layer and having first and second regions, said first region having a dimension which is wide with respect to a wavelength of an electron in said lightly doped semiconductor layer and said second region having a corresponding dimension which is narrow with respect to the wavelength of the electron in said lightly doped semiconductor layer.

12. A semiconducting device as recited in claim 1, including means for confinement of electron motion in said conductive layer in a direction orthogonal to said at least one dimension sufficient for quantization of said electron motion.

13. A semiconducting device as recited in claim 12, wherein said conductive layer is an inversion layer at a semiconductor-insulator interface.

14. A semiconducting device as recited in claim 13, wherein said semiconductor layer is a lightly doped p-type layer.

* * * * *